(12) United States Patent
Trout

(10) Patent No.: US 7,224,297 B2
(45) Date of Patent: May 29, 2007

(54) COMPRESSING LOG FILES

(75) Inventor: Jeffrey Trout, Tewksbury, MA (US)

(73) Assignee: Lycos, Inc., Waltham, MA (US)

( * ) Notice: Subject to any disclaimer, the term of this patent is extended or adjusted under 35 U.S.C. 154(b) by 0 days.

(21) Appl. No.: 11/265,491

(22) Filed: Nov. 2, 2005

(65) Prior Publication Data
US 2007/0096952 A1 May 3, 2007

(51) Int. Cl.
H03M 7/30 (2006.01)

(52) U.S. Cl. .................................. 341/87; 709/224

(58) Field of Classification Search ............... 341/87, 341/50; 375/361; 709/224
See application file for complete search history.

(56) References Cited

U.S. PATENT DOCUMENTS 5,893,084 A * 4/1999 Morgan et al. ............. 706/50
5,956,490 A * 9/1999 Buchholz et al. ........... 709/245
6,885,716 B1 * 4/2005 Zalud et al. ................ 375/361
2004/0133671 A1 * 7/2004 Taniguchi ................... 709/224

* cited by examiner

Primary Examiner—Rexford Barnie
Assistant Examiner—Joseph Lauture
(74) Attorney, Agent, or Firm—Fish & Richardson P.C.

(57) ABSTRACT

Data is compressed, which includes first through sixth patterns having respective first through sixth values, where the first pattern precedes the second pattern in the data, the third pattern precedes the fourth pattern in the data, and the fifth pattern precedes the sixth pattern in the data. Compression includes outputting a first code and the second value if the second value exceeds the first value by more than a predetermined amount, outputting a second code and a difference between the third and fourth values if the fourth value does not exceed the third value by more than the predetermined amount, and outputting the fifth value and the sixth value if the sixth value exceeds the fifth value by a predefined number.

20 Claims, 5 Drawing Sheets $P_{N+1} > P_N + 253$ $P_{N+1} \leq P_N + 253$ $P_{N+1} - P_N = 1$

COMPRESSING LOG FILES

TECHNICAL FIELD

This patent application relates generally to compressing data and, more particularly, to compressing log files in Web servers.

BACKGROUND

Internet use, particularly electronic commerce (E-commerce), has experienced considerable growth in recent years. E-commerce, in its current form, is supported by vendors, advertisers and service providers, all of which use Web servers to respond to client requests for goods, services and information. A Web server typically maintains one or more log files, which contains information relating to access of the Web server. For example, Web server log file(s) may contain information relating to a transaction performed via the Web server. Log files can take up large amounts of storage. This can be problematic, particularly for Web servers that accommodate high amounts of Web traffic.

SUMMARY

This patent application describes apparatus and methods, including computer program products, for compressing log files.

In general, in one aspect, the invention is directed to compressing data comprised of first through sixth patterns having respective first through sixth values, where the first pattern precedes the second pattern in the data, the third pattern precedes the fourth pattern in the data, and the fifth pattern precedes the sixth pattern in the data. This aspect includes outputting a first code and the second value if the second value exceeds the first value by more than a predetermined amount, outputting a second code and a difference between the third and fourth values if the fourth value does not exceed the third value by more than the predetermined amount, and outputting the fifth value and the sixth value if the sixth value exceeds the fifth value by a predefined number.

The foregoing aspect may include scanning the data for a pattern that repeats and replacing the pattern that repeats with a run-length value. The data may be date information that is part of a log file of a Web server. The data may include a string comprised of the first through sixth patterns. The first and second patterns may be adjacent in the string, the third and fourth patterns may be adjacent in the string, and the fifth and sixth patterns may be adjacent in the string. This aspect may include outputting the second code and a difference between the first and second values if the second value does not exceed the first value by more than the predetermined amount, and outputting the first code and the third value if the fourth value exceeds the third value by more than the predetermined amount.

In general, in another aspect, the invention is directed to compressing data comprised of a sequence of data strings. This aspect includes outputting a first code for a first data string that occurs more than once in the data; outputting a second code and a corresponding second string identifier for a second data string in the data, where the second string identifier is predefined; outputting a third code, a corresponding third string length, and a corresponding third string identifier for a third data string in the data; and outputting a fourth code and a corresponding fourth run length value for a fourth data string that occurs repeatedly in the data. The fourth run length value corresponds to a number of consecutive repetitions of the fourth data string.

The foregoing aspect may include outputting, along with the first code, a corresponding first run length value for the first data string, where the first run length value corresponds to a number of consecutive repetitions of the first data string. This aspect may also include identifying the first data string in the data and storing the first code. Outputting the first code for a first data string that occurs more than once in the data may include encountering the first data string and retrieving the first code for output. The first code may be stored in a table that indexes the first code to the first data string.

In general, in another aspect, the invention is directed to compressing data comprised of a sequence of data strings. This aspect includes defining compression rules for at least some of the data strings, where the compression rules are based on arguments contained in the data strings. This aspect also includes storing the compression rules in association with corresponding user request identifiers (URIs), receiving an input data string, where the input data string corresponds to a URI, identifying a stored compression rule by matching the URI of the input data string to the URI of the stored compression rule, and compressing the input data string according to the stored compression rule.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
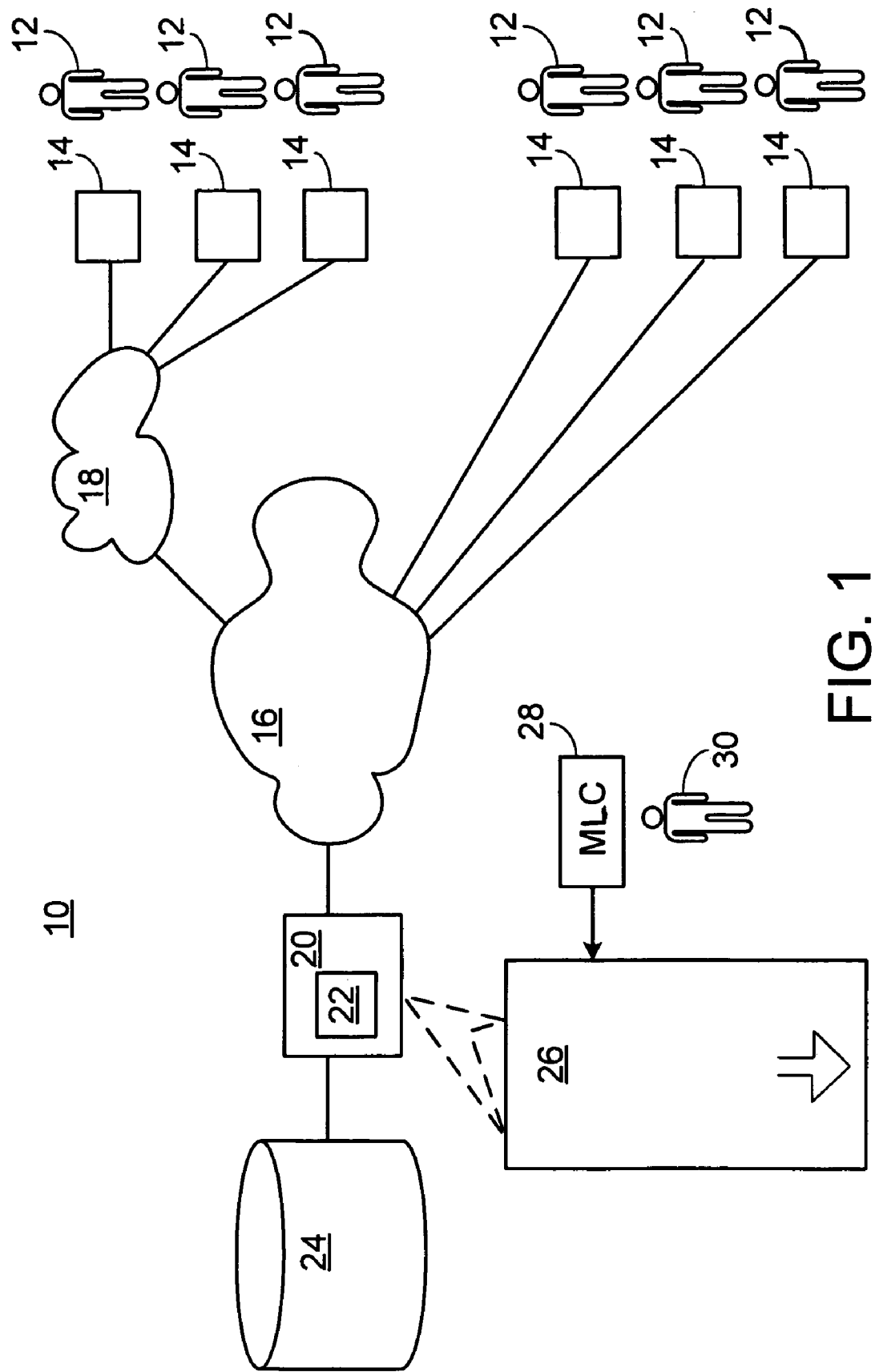
FIG. 1 is a diagram of a network that includes Web servers that store log files.

Referring to FIG. 1, network 10 enables clients 12 to access Web pages, files, and services from a remote Web database 24. Web database 24 may be accessed through a Web server 22 located in computer 20 that is connected to a public network, e.g., Internet 16. Clients 12 use communication devices 14 connected to Internet 16 directly or over an exemplary Internet access network 18 to send client requests to Web server 22. Web server 22 records client requests in a log file 26. Clients 12 may include any Web-capable device, such as a mobile telephone, a personal digital assistant (PDA), laptop or desktop computer, and the like. As the number of client requests increases, the size of log file 26 increases, necessitating excess storage space. An administrator 30 of Web server 22 uses a massive log compression (MLC) utility 28 (described below) to reduce the size of log file 26.

Web server 22 records requests received from clients 12 in log file 26 in a specific log format. To specify the log format, administrator 30 creates, in a configuration file of Web server 22, a log format configuration. The log format configuration specifies what pieces of information to record in log file 26 from each received client request. Information recorded for a client request may include, e.g., a date, including the time, when a client request is received and processed in the Web server 22. Examples of other such information include, but are not limited to, identities of clients 12, host names of client communication devices 14, and query strings (e.g., strings input to a search engine or other application to obtain information). The log format configuration specifies the format of each piece of information recorded in the log file 26. The recording format may be dictated by information type. For example, dates are recorded in a Unix epoch format, while user identifications, host names and query strings are recorded in a string of characters format.

Compression of log file 26 is based on recognizing that each recording format has distinct features that may be used in different ways to compress the information contained therein. A different compression process (or "compressor") may be used for each format. In particular, MLC utility 28 includes different compressors to compress dates, character strings, and query strings contained in log file 26. In this regard, administrator 30 knows, from the log format configuration, how (e.g., the format) information is stored in log file 26. As such, administrator 30 can instruct MLC utility 28 to use specialized compressors, such as a date compressor to compress dates, a string compressor to compress character strings and, a query string compressor to compress query strings. For example, the administrator 30 may enter, at a console of server 26, a command such as "mlc do_dates" to instruct MLC utility 28 to use the date compressor to compress the dates, "mlc do_strings" to instruct MLC utility 28 to use the string compressor to compress the character strings, "mlc do_qs" to instruct MLC utility 28 to use the query string compressor to compress the query strings, or "mlc do_all" to instruct MLC utility 28 to use all the compressors to compress, dates, character strings, and query strings. If administrator 30 instructs MLC utility 28 to use several compressors, MLC utility 28 may automatically split log file 26 into parts, each having a format that corresponds to a specified compressor. For example, one part may include dates, another part character strings, and so on.

Date Compressor/Decompressor

Figure 2:
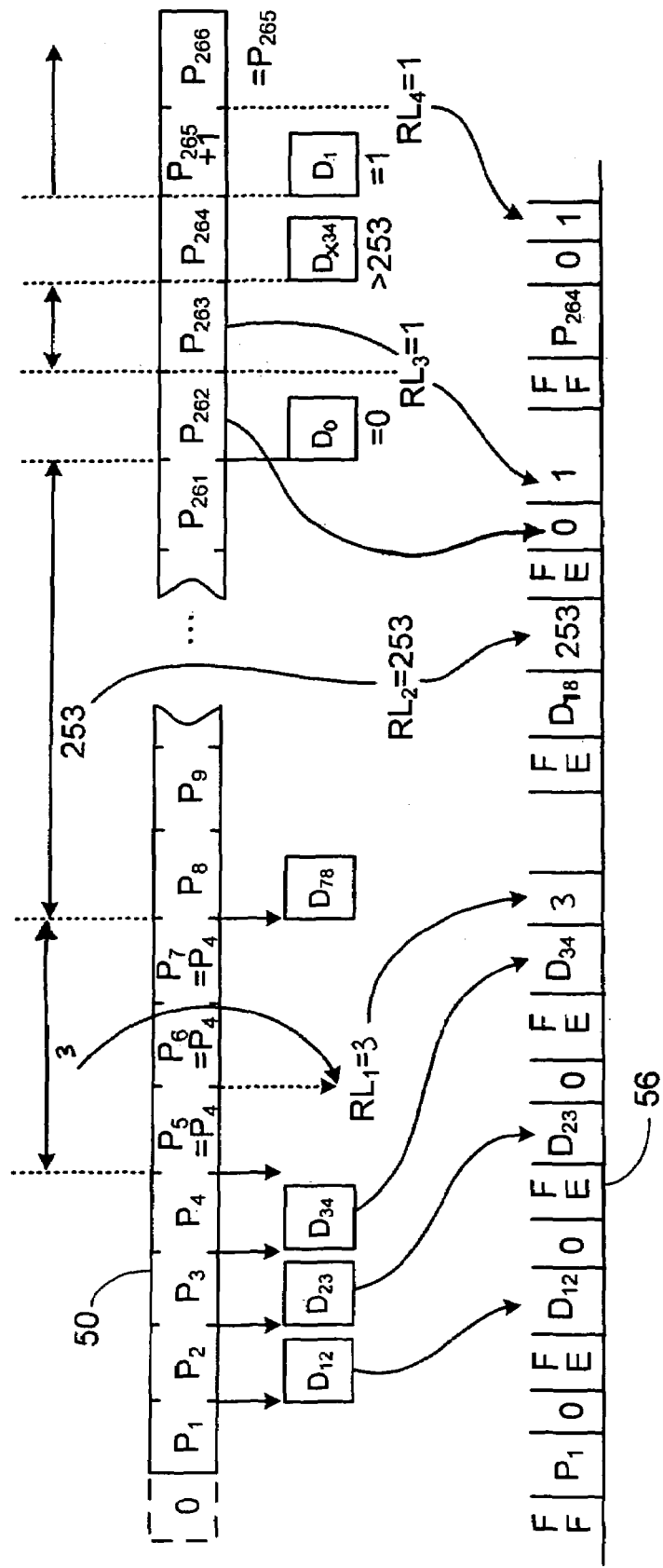
FIG. 2 is a diagram illustrating compression of dates in a log file.

As shown in FIG. 2, the date compressor compresses a sequence of dates 50 from log file 26 to produce a compressed string 56. Sequence of dates 50 is shown as a sequence of patterns $P_1$, $P_2$, $P_3$ to $P_{265}$. In this example, each pattern $P_X$ includes a date that is recorded in a Unix® epoch format, which is the number of seconds elapsed since Jan. 1, 1970, stored as a 32-bit unsigned integer. A feature of the sequence of patterns $P_1$, $P_2$, $P_3$, etc. is that the patterns are arranged in ascending order. Numerous adjacent subsequent patterns are equal due to the resolution at which user requests arriving close in time are recorded. Also, numerous adjacent patterns differ by one second, especially in cases where adjacent patterns are part of a group of patterns that arrived close in time.

Figure 3A:
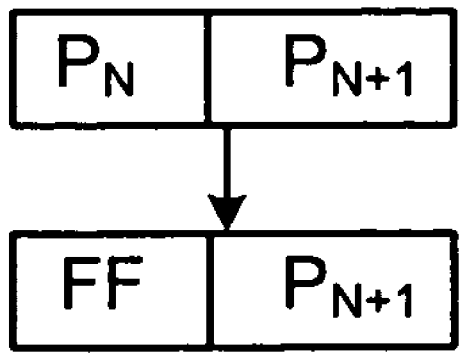
FIGS. 3a to 3c are diagrams illustrating compression rules for compressing dates.
Figure 3B:
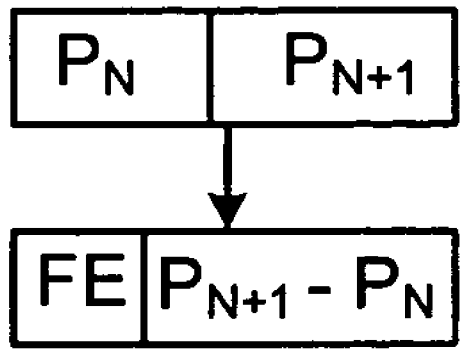
Figure 3C:
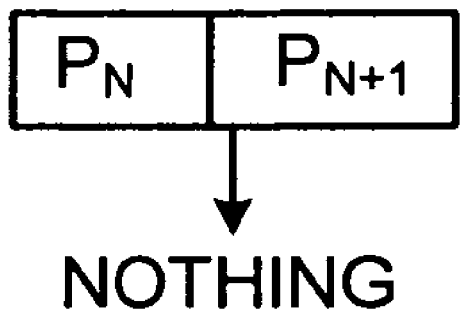

As shown in FIGS. 3a, 3b, and 3c, features of a sequence of date patterns may be used to derive to a set of date compression rules. As shown in FIG. 3a, if a pattern $P_{N+1}$ exceeds a preceding pattern $P_N$ by more than 253, a code "FF", followed the pattern $P_{N+1}$, is inserted in an output compressed string, such as compressed string 56 of FIG. 2. As shown in FIG. 3b, if a pattern $P_{N+1}$ exceeds a preceding pattern $P_N$ by less than or equal to 253, a code "FE", followed by the difference ($P_{N+1}-P_N$), is inserted into an output compressed string. As shown in FIG. 3c, if a pattern $P_{N+1}$ exceeds the preceding pattern $P_N$ by 1, no additional information is inserted in the output compressed string.

When adjacent patterns are equal, the number of adjacent equal patterns is determined (e.g., counted) and a "run-length" (RL) is inserted into the resulting compressed string. In this implementation, the RL of a target pattern corresponds to the number of adjacent subsequent patterns that are equal to (i.e., have a same content as) the target pattern. For a target pattern, the date compressor may scan adjacent subsequent patterns in an attempt to determine a run-length for the target pattern. If an RL is determined for the target pattern, all equal adjacent subsequent patterns are replaced, in the resulting compressed string, by an appropriate RL value. It is noted that RL may be limited by the number of codes used by the set of date compression rules. For example, the date compression rules illustrated by FIGS. 3a, 3b, and 3c use two compression codes "FF" and "FE" to code distinct rules in an 8-bit byte. The 8-bit byte can store a maximum number of 255, but because the values 255 (hexadecimal value FF) and 254 (hexadecimal value FE) are used as codes, the maximum number used for the RL here is 253.

As shown in FIG. 2, the date compression rules described above may be combined with RLs to compress a sequence of dates, such as exemplary sequence of dates 50. In operation, the date compressor starts with a first pattern $P_1$, and inserts $P_1$ after an initial "FF" code. In this case, code "FF" indicates that $P_1$ is a true date value, not an offset from a preceding date. In the example of FIG. 2, a null (0) run-length is inserted after $P_1$, since $P_2$ is not equal to $P_1$. Next, the date compressor determines pattern differences $D_{12}$, $D_{23}$, $D_{34}$, $D_{67}$, $D_{78}$ between corresponding patterns, where a pattern difference $D_0$ is equal to 0 between $P_{26}$, and $P_{262}$, a pattern difference $D_{X34}$ is greater than 253 between $P_{263}$ and $P_{264}$, and a pattern difference $D_1$ is equal to 1 between $P_{264}$ and $P_{265}$.

Also, the date compressor scans sequence of dates 50 to determine a number of RLs that are other than 0. In this case, $RL_1$ is equal to 2 because $P_5$ and $P_6$ are equal to $P_4$; $RL_2$ is equal to 253 because $P_9$ to $P_{261}$ are equal to $P_8$; $RL_3$ is equal to 1 because $P_{263}$ is equal to $P_{262}$; and $RL_4$ is equal to 1 because $P_{266}$ is equal to $P_{265}$. For each pattern difference that is less than or equal to 253, the date compressor inserts an "FE" code, followed by the corresponding pattern difference, followed by the corresponding run-length in the compressed string 56. For example, in order to compress patterns $P_4$ to $P_7$, the date compressor inserts, in compressed string 56, an "FE" code, followed by $D_{34}$, followed by "3" ($RL_1$). In order to compress patterns $P_7$ to $P_{261}$, the date compressor inserts an "FE" code, followed by $D_{78}$, followed by "253" ($RL_2$). As $RL_2$ reaches the 253 limit, which corresponds to 253 equal patterns ($P_8$ to $P_{261}$), and the sequence of adjacent equal patterns extends from $P_8$ to $P_{263}$, the date compressor inserts an "FE" code followed by a 0 value ($D_0$) immediately after $RL_2$. For pattern difference $D_{X34}$, which is greater than 253, the date compressor inserts an "FF" code, followed by the pattern (here, $P_{264}$). For pattern difference $D_1$ equal to 1, the date compressor inserts $RL_4$, but not a code.

For each compressor, MLC utility 28 also includes a corresponding decompressor. Each decompressor decompresses a log file that has been compressed via the corresponding compressor. For example, a date decompressor may decompress a compressed string in a sequence of dates, such as compressed string 56. In this implementation, the date decompressor reads a first code in compressed string 56, here "FF", which indicates that a date pattern follows, in this case $P_1$. The decompressor therefore inserts $P_1$ in the sequence of dates 50. The following RL equal to 0 instructs the decompressor not to repeat $P_1$ in the sequence of dates 50. The next code, here "FE", instructs the decompressor to read $D_{12}$, to add it to $P_1$ to determine $P_2$, and to insert $P_2$ in sequence of dates 50. Since the following RL is 0, $P_2$ is not repeated in sequence of dates 50. This process is repeated for $D_{23}$. The decompressor reads $D_{34}$, determines $P_4$, and repeats $P_4$ three times in sequence of dates 50 ($P_4$, $P_5$, $P_6$), as instructed by the RL following $D_{34}$, which is equal to 3. The decompressor reads $D_{78}$, determines $P_7$, and repeats $P_7$ 253 times in sequence of dates 50 ($P_8$ to $P_{261}$), as instructed by the RL following $D_{78}$, which is equal to 253. $P_{262}$ is determined by adding 0 to $P_{261}$, as instructed by the sequence "FE", "0", which follows the RL associated with $P_{261}$. When the decompressor reads the "FF" code, followed by $P_{264}$, followed by a RL equal to 0, the decompressor inserts $P_{264}$ in sequence of dates 50, without repeating $P_{264}$. When the decompressor reads a value "1" immediately after the RL associated with $P_{264}$, the decompressor adds 1 to $P_{264}$ in order to determine $P_{265}$ and interprets the value "1" as a RL, thus repeating $P_{265}$ to determine $P_{266}$, equal to $P_{265}$.

Character String Compressor/Decompressor

Figure 4:
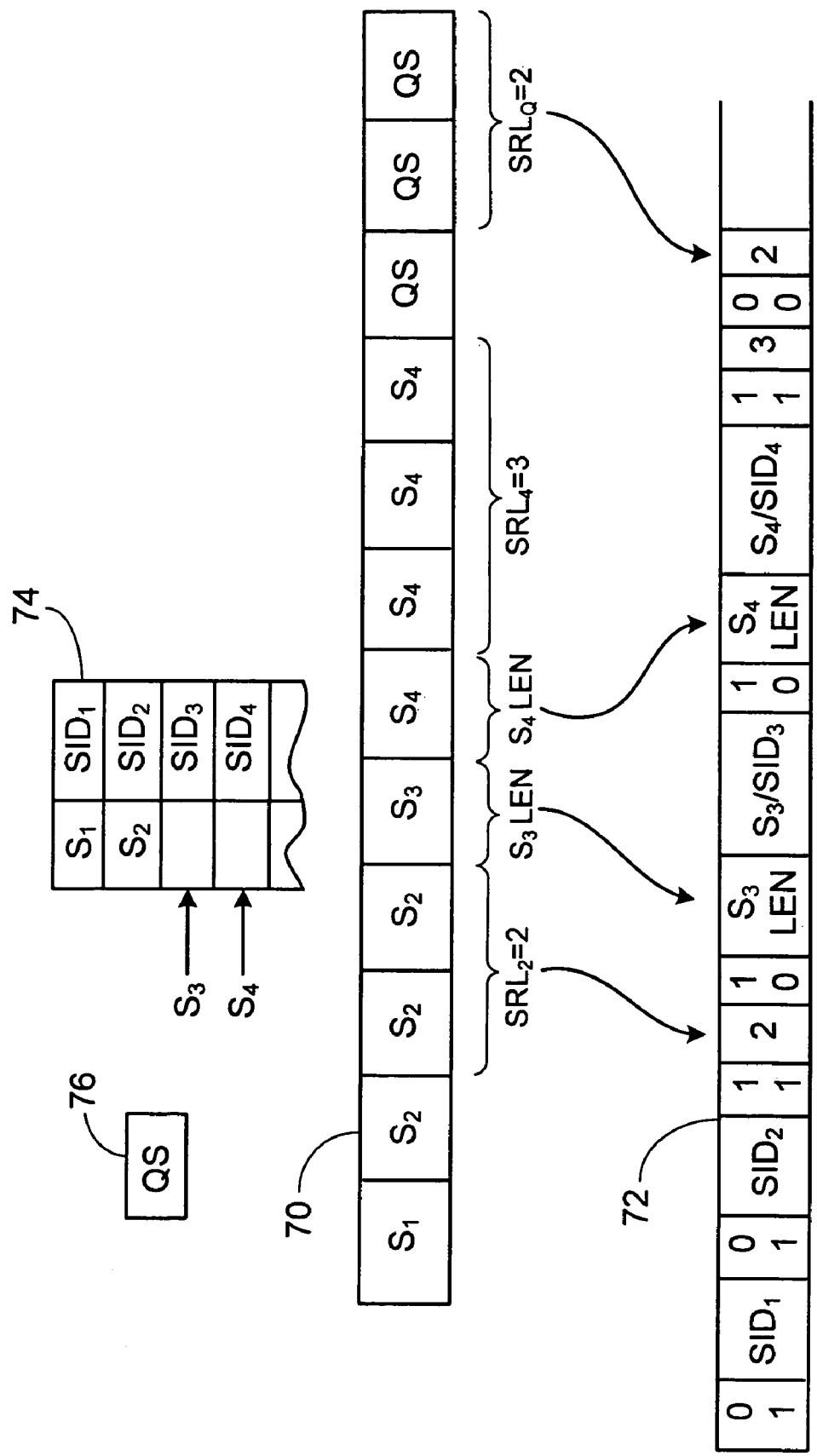
FIG. 4 is a diagram illustrating compression of character strings in a log file.

As shown in FIG. 4, a string compressor compresses an exemplary sequence of strings 70 from log file 26 to produce compressed string 72. As shown, string sequence 70 includes exemplary character strings $S_1$, $S_2$, $S_3$, $S_4$ and QS. A feature of string sequence 70 is that the same strings are repeated often. Of the repeated strings, administrator 30 may identify one or more strings that appear to be repeated most often. The most often repeated strings, referred to here as "quick strings" (QS), are passed as "predefined strings" to the string compressor. Also, many repeated strings occur in adjacent positions in string sequence 70. The string compressor uses the QS and the repeated and adjacent occurrence of other strings to enhance the compression of string sequence 70. In this example, administrator 30 passes the string compressor string QS 76 for further processing.

Figure 5A:
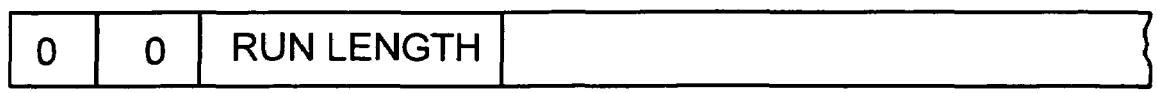
FIGS. 5a to 5d are diagrams illustrating compression rules for compressing character strings.

As shown in FIGS. 5a to 5d, a set of rules are applied to compress string sequence 70. As shown in FIG. 5a, when a QS is encountered in the string sequence, the QS may be replaced by a QS string compression code, for example, a 2-bit field code "00". If the QS is repeated in adjacent positions in the string sequence, adjacent occurrences of QS are replaced by the number of adjacent occurrences, called the string run-length (SRL). For example, in an 8-bit byte, if two bits are used for QS compression, the SRL may be counted in the remaining six bits, up to a maximum of 63 occurrences. For example, a sequence of 64 adjacent occurrences of QS may be compressed in a single byte that includes the QS compression code "00" and a corresponding SRL of 63.

Figure 5B:

As shown in FIG. 5b, a character string that was previously encountered may be replaced by a compression code "01," which may be encoded in a 2-bit field, and a previously assigned "string identifier" (SID). Referring back to FIG. 4, when a string, such as $S_3$, is encountered for a first time in string sequence 70, the compressor assigns the string an SID, and stores the string in table 74 along with its SID (here, $SID_3$). When the string compressor reads a string from string sequence 70, the string compressor determines if the string was previously encountered by searching for the string in table 74. If the string is found in table 74, its SID is retrieved and used to encode the string.

Figure 5C:

As shown in FIG. 5c, a string that is encountered for the first time is replaced by a compression code, e.g., "10", in a 2-bit field, followed by a length of the string, followed by the string and/or the SID assigned to the string. If there are a relatively small number of character strings (e.g., request objects), fewer bits are required to express the SID. This implementation uses six bits, as noted above. However, as more character strings are included, the size of the SID may increase beyond a value that can be expressed using six bits. When the SID passes this six bit maximum, additional bits may be used to express the QS compression code. For example, an additional eight bits may be included. In some implementations, the SID can expand by 8-bits at a time, however, the invention is not so limited and the SID may be represented using any suitable number of bits.

Figure 5D:

As shown in FIG. 5d, equal adjacent strings are replaced by a compression code, e.g., "11", in a 2-bit field and an SRL corresponding to the number of adjacent strings.

As shown in FIG. 4, the compression rules of FIGS. 5a to 5d may be applied to compress string sequence 70 to produce compressed string 72. The string compressor reads a string $S_1$ from string sequence 70, locates $S_1$ in table 74, and replaces, in compressed string 72, $S_1$ with "01" followed by $SID_1$ (according to the rule of FIG. 5b). Next, the string compressor reads string $S_2$, locates $S_2$ in table 74, and replaces $S_2$ with "01" followed by $SID_2$ in compressed string 72. Because two equal adjacent strings $S_2$ ($SRL_2$=2) follow $S_2$, those strings are replaced, in compressed string 72, with "11" followed by $SRL_2$ (according to the rule of FIG. 5d). When the string compressor encounters $S_3$, it does not find $S_3$ in table 74. Accordingly, the string compressor inserts, in compressed string 72, "10", followed by the length of $S_3$ (S3 LEN), followed by $S_3$, followed by $SID_3$ (according to the rule of FIG. 5c). The same rule applies for $S_4$. Since three equal adjacent strings ($SRL_4$=3) follow $S_4$, those strings are replaced by "11" followed by $SRL_4$ (according to the rule of FIG. 5d). When the string compressor reads the string QS from string sequence 70, the string compressor finds that QS matches QS 76, which was predefined, e.g., by administrator 30. The string compressor replaces, in compressed string 72, QS and the next two adjacent QS ($SRL_Q$=2) with "00" followed by $SRL_Q$ (according to the rule of FIG. 5a).

A string decompressor, which may be part of MLC utility 28, may be used to decompress a compressed string, such as compressed string 72. When decompressing compressed string 72, the string decompressor encounters "01", which precedes $SID_1$. The string decompressor reads $SID_1$, searches table 74 for $SID_1$, finds $SID_1$, and thereby locates corresponding string $S_1$. The string decompressor reads $S_1$ and places $S_1$ in string sequence 70. Next, the string decompressor processes code "01" that precedes $SID_2$ and places $S_2$ in string sequence 70. Next, when the string decompressor encounters compression code "11" followed by 2 ($SRL_2$), the string decompressor inserts two strings $S_2$ in string sequence 70. Next, the string decompressor encounters "10", reads the length of $S_3$, reads $S_3$ and $SID_3$ (knowing the length of $S_3$), copies $S_3$ and $SID_3$ in table 74, and inserts $S_3$ in string sequence 70. Next, the string decompressor processes "10" followed by the length of $S_4$ (S4 LEN), followed by $S_4$ and $SID_4$, updates table 74 with an entry for $S_4$ and inserts $S_4$ in string sequence 70. The string decompressor repeats $S_4$ three times in the string sequence 70, because the string decompressor encounters "11" followed by 3 ($SRL_4$=3). Next, when the string decompressor encounters "00," the string decompressor inserts QS 76 in string sequence 70. Since "00" is followed by 2 ($SRL_Q$=2), the string decompressor inserts two more QS strings in string sequence 70.

Query String Compressor/Decompressor

Query string compressor operation is based on the structure of query strings. The structure of a query string is typically different from that of other character strings in that a query string includes one or more predefined arguments and is defined by a particular syntax, which is known to administrator 30. For example, Web server 22 may equate the query string structure to the syntax of a common gateway interface (CGI). In this regard, CGI is a standard for interfacing applications run by clients 12 with HTTP or Web servers, such as Web server 22, which provide information to clients 12.

According to the CGI syntax, a client request includes a user request identifier (URI) and a query string. The query string follows a "?" symbol in the client request and continues until the end of the client request. For example, the client request "/readmessage.cgi board=foo&messagenum=123456" includes the URI "/readmessage.cgi" and the query string "board=foo&messagenum=123456". URIs identify client requests from different applications from different clients 12. However, administrator 30 knows the structure of each query string in each client request identified by a URI. For example, administrator 30 knows that client requests identified by the URI "/readmessage.cgi" include a string query which has a fixed structure comprised of a list of two arguments, which includes arguments names "board" and "messagenum" and corresponding argument variables "foo" and "123456". Knowing the structure of the client requests, in particular the structures of arguments in query strings, administrator 30 instructs the query string compressor to compress query strings by specifying a compression rule for each query string in the client requests. For example, the rule to compress the query string "board=foo&messagenum=123456" instructs the query string compressor how to compress the string variable "foo" and the numerical variable "123456".

In this regard, administrator 30 may construct a compression rule for each query string that is expected to be received in a client request. A compression rule for a particular query string instructs the query string compressor how to compress arguments in that query string. In this implementation, there are four types of arguments: string arguments, 16-bit integer arguments, 24-bit integer arguments, and raw arguments. Raw arguments are arguments that administrator 30 has determined not to compress. In the compression rules, administrator 30 specifies methods to compress string arguments, 16-bit integer arguments, and 24-bit integer arguments. Applying the rules, the query string compressor compresses the string arguments, replaces the 16-bit and 24-bit integer arguments with their binary values, and preserves the raw arguments unchanged.

Certain string argument values may be commonly found in client requests from different clients 12. Such string argument values may be declared as "shared" by administrator 30. Administrator 30 may store compression rules for query strings in the configuration file of Web server 22 and also include the compression rules in an output stream in compressed log file 26 to be used when decompressing query strings.

For example, the administrator 30 may write an exemplary set of query strings compression rules in the following format:
  shared string(-) BostonBoard
  /readmessage.cgi board=BostonBoard&messagenum=int24
  /postmessage.cgi board=BostonBoard&message=raw
  /readmail.cgi board=str&messagelen=int16

When the query string compressor encounters a client request in log file 26, the query string compressor attempts to match the URI of the client request with a URI in one of the query compression rules. If, for example, "/readmessage.cgi" matches a URI in one of the query compression rules, the URI "/readmessage.cgi" is treated as a string and replaced by its SID. By matching a URI and replacing it with its corresponding SID, the query string compressor identifies a corresponding query string. Since the structure of the corresponding query string is described by the compression rule, the query string compressor need only compress the query string arguments. For example "BostonBoard", from the above query strings, may be replaced by its SID and the argument value "messagenum" may be replaced by its 24-bit binary value, as instructed by "int24". If "/postmessage.cgi" matches a URI in one of the query compression rules, the URI "/postmessage.cgi" may be replaced by its SID, "BostonBoard" may be replaced by its SID, which is the same SID shared with the "/readmessage.cgi", and the argument value of "message" may be unchanged, as instructed by "raw". If "/readmail.cgi" matches a URI in one of the query compression rules, the URI "/readmail.cgi" may be replaced by its SID, the argument value of "board" may be compressed as a string of characters, as instructed by "str", and the argument value of "messagelen" may be replaced by its 16-bit binary value, as instructed by "int16". If the URI in a client request cannot be matched with any of the URIs of the compression rules, the client request is not compressed in this implementation.

To decompress query strings, a query string decompressor uses the same set of compression rules as the corresponding query string compressor. When the query string decompressor encounters a SID that matches a URI in a compression rule, the matching compression rule is inserted in a decompressed stream and argument values therefrom are incorporated into the inserted rule.

IMPLEMENTATIONS

All or part of the compression/decompression processes described herein, and any modifications thereto, (hereinafter, "the processes") can be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Actions associated with the processes can be performed by one or more programmable processors executing one or more computer programs to perform the functions described herein. The actions can also be performed by, and the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include a processor for executing instructions and one or more storage area devices for storing instructions and data. Generally, a computer will also include, or be operatively coupled to receive data from, or transfer data to, or both, one or more mass storage devices for storing data, e.g., magnetic, magneto-optical disks, or optical disks. Information carriers suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

All or part of the processes can be implemented in a computing system that includes a back-end component, e.g., as a data server, or that includes a middleware component, e.g., an application server, or that includes a front-end component, e.g., a client computer having a graphical user interface, or any combination of such back-end, middleware, or front-end components. The components of the system can be interconnected by any form or medium of digital data communication, e.g., a communication network. Examples of communication networks include a LAN and a WAN, e.g., the Internet.

Actions associated with the processes can be rearranged and/or one or more such actions can be omitted to achieve the same, or similar, results to those described herein.

The processes described herein are not limited to use in an Internet context or even to use with log files. Rather, the compression/decompression processes may be used to compress/decompress any type of data which may, or may not, be stored in a log file.

Elements of different embodiments described herein may be combined to form other embodiments not specifically set forth above. Other embodiments not specifically described herein are also within the scope of the following claims.

What is claimed is:

1. A method of compressing data comprised of first through sixth patterns having respective first through sixth values, where the first pattern precedes the second pattern in the data, the third pattern precedes the fourth pattern in the data, and the fifth pattern precedes the sixth pattern in the data, the method comprising:
providing first compressed data comprising a first code and the second value if the second value exceeds the first value by more than a predetermined amount;
providing second compressed data comprising a second code and a difference between the third and fourth values if the fourth value does not exceed the third value by more than the predetermined amount;
providing third compressed data comprising the fifth value and the sixth value if the sixth value exceeds the fifth value by a predefined number; and
storing, in memory, at least one of the first compressed data, the second compressed data, and the third compressed data.

2. The method of claim 1, further comprising:
scanning the data for a pattern that repeats; and
replacing the pattern that repeats with a run-length value.

3. The method of claim 1, wherein the data comprises a string comprised of the first through sixth patterns; and
wherein the first and second patterns are adjacent in the string, the third and fourth patterns are adjacent in the string, and the fifth and sixth patterns are adjacent in the string.

4. The method of claim 1, wherein the data comprises date information that is part of a log file of a Web server.

5. The method of claim 1, further comprising:
providing the second code and a difference between the first and second values if the second value does not exceed the first value by more than the predetermined amount; and
providing the first code and the third value if the fourth value exceeds the third value by more than the predetermined amount.

6. A method of compressing data comprised of a sequence of data strings, the method comprising:
providing first compressed data comprising a first code for a first data string that occurs more than once in the data;
providing second compressed data comprising a second code and a corresponding second string identifier for a second data string in the data, the second string identifier being predefined;
providing third compressed data comprising a third code, a corresponding third string length, and a corresponding third string identifier for a third data string in the data;
providing fourth compressed data comprising a fourth code and a corresponding fourth run length value for a fourth data string that occurs repeatedly in the data, the fourth run length value corresponding to a number of consecutive repetitions of the fourth data string; and
storing, in memory, at least one of the first compressed data, the second compressed data, the third compressed data, and the fourth compressed data.

7. The method of claim 6, further comprising:
providing, along with the first code, a corresponding first run length value for the first data string, the first run length value corresponding to a number of consecutive repetitions of the first data string.

8. The method of claim 6, further comprising:
identifying the first data string in the data; and
storing the first code;
wherein providing the first compressed data comprises encountering the first data string and retrieving the first code for output.

9. The method of claim 6, wherein the first code is stored in a table that indexes the first code to the first data string.

10. A method of compressing data, the method comprising:
storing compression rules in association with corresponding user request identifiers (URIs), wherein different URIs are associated with one or more arguments having different structures, and each compression rule is associated with a URI and is for compressing at least one argument having a fixed structure that is associated with the URI
receiving an input argument, the input argument corresponding to a URI;
identifying a stored compression rule by matching the URI of the input argument to the URI of the stored compression rule;
compressing the input argument according to the stored compression rule to produce a compressed input argument; and
storing the compressed input argument in memory.

11. One or more machine-readable media for storing instructions to compress data comprised of first through sixth patterns having respective first through sixth values, where the first pattern precedes the second pattern in the data, the third pattern precedes the fourth pattern in the data, and the fifth pattern precedes the sixth pattern in the data, the instructions for causing one or more processing devices to:

provide first compressed data comprising a first code and the second value if the second value exceeds the first value by more than a predetermined amount;

provide second compressed data comprising a second code and a difference between the third and fourth values if the fourth value does not exceed the third value by more than the predetermined amount;

provide third compressed data comprising the fifth value and the sixth value if the sixth value exceeds the fifth value by a predefined number; and store, in memory, at least one of the first compressed data, the second compressed data, and the third compressed data.

12. The one or more machine-readable media of claim 11, further comprising instructions that cause the one or more processing devices to:

scan the data for a pattern that repeats; and replace the pattern that repeats with a run-length value.

13. The one or more machine-readable media of claim 11, wherein the data comprises a string comprised of the first through sixth patterns; and wherein the first and second patterns are adjacent in the string, the third and fourth patterns are adjacent in the string, and the fifth and sixth patterns are adjacent in the string.

14. The one or more machine-readable media of claim 11, wherein the data comprises date information that is part of a log file of a Web server.

15. The one or more machine-readable media of claim 11, further comprising instructions that cause the one or more processing devices to:

provide the second code and a difference between the first and second values if the second value does not exceed the first value by more than the predetermined amount; and provide the first code and the third value if the fourth value exceeds the third value by more than the predetermined amount.

16. One or more machine-readable media for storing instructions to compress data comprised of a sequence of data strings, the instructions for causing one or more processing devices to:

provide first compressed data comprising a first code for a first data string that occurs more than once in the data;

provide second compressed data comprising a second code and a corresponding second string identifier for a second data string in the data, the second string identifier being predefined;

provide third compressed data comprising a third code, a corresponding third string length, and a corresponding third string identifier for a third data string in the data;

provide fourth compressed data comprising a fourth code and a corresponding fourth run length value for a fourth data string that occurs repeatedly in the data, the fourth run length value corresponding to a number of consecutive repetitions of the fourth data string; and store, in memory, at least one of the first compressed data, the second compressed data, the third compressed data, and the fourth compressed data.

17. The one or more machine-readable media of claim 16, further comprising instructions that cause the one or more processing devices to:

provide, along with the first code, a corresponding first run length value for the first data string, the first run length value corresponding to a number of consecutive repetitions of the first data string.

18. The one or more machine-readable media of claim 16, further comprising instructions that cause the one or more processing devices to:

identify the first data string in the data; and store the first code;

wherein providing the first compressed data comprises encountering the first data string and retrieving the first code for output.

19. The one or more machine-readable media of claim 16, wherein the first code is stored in a table that indexes the first code to the first data string.

20. One or more machine-readable media for storing instructions to compress data, the instructions for causing one or more processing devices to:

store compression rules in association with corresponding user request identifiers (URIs), wherein different URIs are associated with one or more arguments having different fixed structures, and each compression rule is associated with a URI and is for compressing at least one argument having a fixed structure that is associated with the URI;

receive an input argument, the input argument corresponding to a URI;

identify a stored compression rule by matching the URI of the input argument to the URI of the stored compression rule;

compress the input argument according to the stored compression rule to produce a compressed input argument; and store the compressed input argument in memory.

* * * * *